United States Patent [19]

Brilka

[11] Patent Number: 5,412,345
[45] Date of Patent: May 2, 1995

[54] AMPLIFIER ARRANGEMENT HAVING A RELATIVELY STABLE REFERENCE POTENTIAL

[75] Inventor: Joachim Brilka, Hamburg, Germany

[73] Assignee: U.S. Philips Corporation, New York, N.Y.

[21] Appl. No.: 215,444

[22] Filed: Mar. 18, 1994

[30] Foreign Application Priority Data

Apr. 7, 1993 [DE] Germany ............ 43 11 411.3

[51] Int. Cl.⁶ .................................. H03F 3/45
[52] U.S. Cl. ............................ 330/257; 330/288
[58] Field of Search ........... 330/252, 257, 260, 288, 330/310

[56] References Cited

U.S. PATENT DOCUMENTS 5,266,852  11/1993  Shigenari et al. ............ 330/257 X

FOREIGN PATENT DOCUMENTS 0094805  4/1990  Japan .................... 330/257

Primary Examiner—Steven Mottola
Attorney, Agent, or Firm—Edward Blocker

[57] ABSTRACT

In order to minimize signal influences on the reference potential in a rail-to-rail amplifier arrangement this arrangement comprises a first differential amplifier which comprises a first and a second transistor whose emitters are coupled to a reference potential via a common first resistor, the collector of the first transistor forming the output node of the amplifier arrangement, a second differential amplifier to whose input side the input signal of the amplifier arrangement is applied, whose output side is coupled to the base of the first transistor of the first differential amplifier, and having an inverting input coupled to the output node of the amplifier arrangement, a first current mirror circuit having an input transistor to which a reference current is applied, having an output transistor which is formed by the second transistor of the first differential amplifier, and having the emitter side of both transistors coupled to a reference potential, and a second current mirror circuit to whose input side the output signal of the first current mirror circuit is applied and whose output side is coupled to the output node of the amplifier arrangement, which second current mirror circuit has two transistors coupled to a supply potential at the emitter side, which transistors are scaled in such a manner that the current supplied by the amplifier arrangement at its output side is twice as large as the input current applied to the arrangement.

8 Claims, 1 Drawing Sheet

5,412,345

AMPLIFIER ARRANGEMENT HAVING A RELATIVELY STABLE REFERENCE POTENTIAL

BACKGROUND OF THE INVENTION

The invention relates to a rail-to-rail amplifier arrangement having a large output swing ranging from substantially the reference potential to substantially the supply voltage.

Particularly with amplifier arrangements of this kind having a large output swing the problem arises that a part of the output current is drained to the reference potential, i.e. a substantial part of the signal current appears on the earth conductor. This is particularly undesirable for integrated circuits because the earth connections of the ICs exhibit such resistances that the reference potential remains no longer constant in the case of a current flowing into the earth conductors. This gives rise to interference with other circuits on the same IC, i.e. output signals of the amplifier arrangement are cross-coupled to other circuit elements on the same IC via the reference potential.

SUMMARY OF THE INVENTION

It is an object of the invention to reduce the influence of the output signal current of the amplifier arrangement on the earth conductor.

This object is achieved by means of an amplifier arrangement comprising a first differential amplifier which comprises a first and a second transistor whose emitters are coupled to a reference potential via a common first resistor, the collector of the first transistor forming an output node of the amplifier arrangement, a second differential amplifier to whose input side the input signal of the amplifier arrangement is applied, whose output side is coupled to the base of the first transistor of the first differential amplifier, and having an inverting input coupled to the output node of the amplifier arrangement, a first current mirror circuit having an input transistor to which a reference current is applied, having an output transistor which is formed by the second transistor of the first differential amplifier, and having the emitter side of both transistors coupled to a reference potential, and a second current mirror circuit to whose input side the output signal of the first current mirror circuit is applied and whose output side is coupled to the output node of the amplifier arrangement, which second current mirror circuit has two transistors coupled to a supply potential at the emitter side, which transistors are scaled in such a manner that the current supplied by the amplifier arrangement at its output side is twice as large as the input current applied to the arrangement.

In principle, the output signal of this amplifier arrangement, which appears on the output node, can influence the earth potential via the first resistor. However, this influence is very small. This is because a kind of current feedback is applied to the first differential amplifier and the first current mirror circuit. This is achieved in that the second transistor of the first differential amplifier is the output transistor of the first current mirror circuit. The first resistor thus acts as a connection to earth potential both for the first differential amplifier and for the first current mirror circuit.

The influence of the output signal current of the amplifier arrangement on the reference potential is reduced in that the second transistor of the first differential amplifier counteracts a current variation caused by the first transistor of the differential amplifier or by the second differential amplifier driving this transistor. If the current through the first transistor of the first differential amplifier increases the current in the second transistor of the first differential amplifier will decrease owing to the negative feedback by means of the first resistor. This also reduces the current of the first current mirror circuit, whose output transistor is identical to the second transistor of the first differential amplifier. The current thus reduced is also diminished accordingly by the second current mirror circuit, which multiplies the current by a factor of 2. The current through the resistor $R_9$ thus remains substantially constant and the influence of the output signal current of the amplifier arrangement on the reference potential is only very small.

A further embodiment of the invention has the advantage that it can enhance this property of the amplifier arrangement in that the emitter of the input transistor of the first current mirror circuit is coupled to reference potential via a second resistor, across which a voltage drop of substantially the same voltage value as that across the first resistor appears.

The signal from the output node of the amplifier arrangement is fed back to an inverting input of the second differential amplifier. The inputs of the second differential amplifier can be arranged in different ways depending on the extent to which the input signal of the amplifier arrangement is to be amplified and depending on whether the input signal is to be inverted or not. If the input signal should not be inverted an advantageous possibility is, in a further embodiment of the invention, that the input signal of the amplifier arrangement is applied to a non-inverting input of the second differential amplifier, and an inverting input of the second differential amplifier is coupled to the output node of the amplifier arrangement and to half the value of the supply potential.

Generally, the supply potential will exhibit positive voltage values relative to the reference potential. In this case, in a further embodiment of the invention, the two transistors of the first differential amplifier and the input transistor of the first current mirror circuit are of the NPN conductivity type, and the two transistors of the second current mirror circuit are of the PNP conductivity type.

DETAILED DESCRIPTION OF THE PREFERRED EMBODIMENTS

Figure 1:
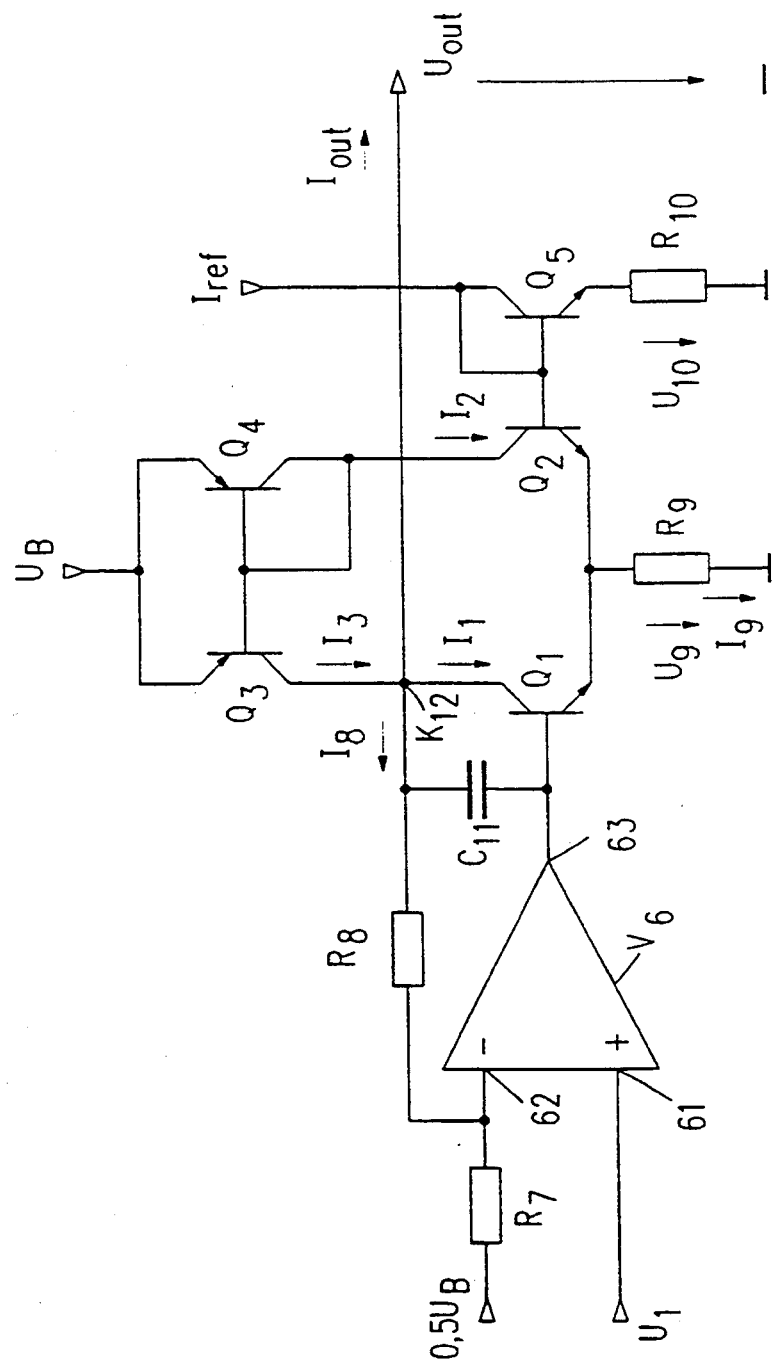
FIG. 1 shows an amplifier arrangement in accordance with the invention.

An exemplary embodiment of the invention will now be described in more detail with reference to the sole Figure of the drawing.

The present example of the amplifier arrangement in accordance with the invention employs a supply potential which exhibits positive voltage values relative to the reference potential.

The Figure shows an amplifier arrangement having a first differential amplifier comprising the transistors $Q_1$ and $Q_2$, a second differential amplifier constructed as an operational amplifier $V_6$, a first current mirror circuit comprising the transistors $Q_5$ and $Q_2$, and a second current mirror circuit comprising the transistors $Q_4$ and $Q_3$.

An input signal $U_1$ supplied to the input side of the amplifier arrangement is applied to a non-inverting input 61 of the operational amplifier $V_6$. Moreover, a supply potential referenced 0.5 $U_B$ in the Figure and having half the value of a supply potential $U_B$ is applied to an inverting input 62 of the operational amplifier $V_6$ via a resistor $R_7$.

The operational amplifier $V_6$ has an output 63 coupled to the base of the first transistor $Q_1$ of the first differential amplifier. The signal on the output 63 is also coupled to the output node $K_{12}$ of the amplifier arrangement via a capacitor $C_{11}$ and to the inverting input 62 of the operational amplifier $V_6$ via a resistor $R_8$.

The output signal of the amplifier arrangement is available on the output node $K_{12}$ of this arrangement.

The first differential amplifier further comprises a second transistor $Q_2$, whose emitter side is connected to the emitter of the transistor $Q_1$. Both transistors are coupled to the reference potential via a resistor $R_9$.

A reference current $I_{ref}$ is supplied to the input side of the first current mirror circuit comprising the transistors $Q_5$ and $Q_2$.

This reference current $I_{ref}$ is applied to the collector and the base of the input transistor $Q_5$ of the first current mirror circuit. The emitter is coupled to the reference potential via a resistor $R_{10}$. The base of the input transistor $Q_5$ of the first current mirror circuit is connected to the base of the second transistor $Q_2$ of the current mirror circuit. This second transistor $Q_2$ of the first current mirror circuit is identical to the second transistor $Q_2$ of the first differential amplifier, whose emitter is connected to the reference potential via the resistor $A_9$.

The collector of the transistor $Q_2$ is connected to the collector and the base of an input transistor $Q_4$ of the second current mirror circuit. The emitter of this input transistor and that of an output transistor $Q_3$ of this second current mirror circuit are connected to the supply potential $U_B$. The bases of the two transistors of the current mirror circuit are interconnected. The collector of the output transistor of the current mirror circuit is connected to the output node $Q_{12}$.

The proportions of the areas of the transistors $Q_2$ and $Q_5$ are substantially equal, whereas the proportions of the areas of the transistors $Q_4$ and $Q_3$ of the second current mirror circuit are such that its output current is twice as large as its input current.

In the drawing the output signal on the node $K_{12}$ of the amplifier arrangement is shown as a voltage having a value $U_{out}$ relative to the reference potential. The output current supplied by the node is referenced $I_{out}$.

The operation of the amplifier arrangement will be described in more detail hereinafter and it is assumed that, as is shown in the Figure, the current flowing from the output node into the collector of the transistor $Q_1$ is $I_1$, the current flowing from the collector of the transistor $Q_3$ into the output node is $I_1$, the current flowing from the output node to the capacitor $C_{11}$ and the resistor $R_8$ is $I_8$, and the current flowing from the collector of the transistor $Q_4$ to the collector of the transistor $Q_2$ is $I_2$.

For the description of the operation of the arrangement it is initially assumed that there is no output current $I_{out}$.

This means that the current sum at the output node $K_{12}$ should be 0. As a consequence:

$$I_{out} + I_1 + I_8 - I_3 = 0 \tag{1}$$

As stated above, the areas of the transistors $Q_3$ and $Q_4$ are proportioned in such a way that:

$$I_1 \approx I_3 = 2 \, I_2 \tag{2}$$

For this, it is assumed that the output current $I_{out} = 0$ and the current $I_8$ is substantially smaller than the current $I_3$.

This also means that $$I_9 = I_1 + I_2 = 3 \, I_2 \tag{3}$$

Further, if $R_{10}$ is selected to be 3 $R_9$, the following holds because $I_9 = 3 \, I_2$:

$$I_2 = I_{ref} \tag{4}$$

The output swing of the amplifier arrangement, i.e. the voltage range of the output signal $U_{out}$, ranges substantially from the reference potential to the supply potential; this means that the arrangement is a so-called rail-to-rail amplifier.

The output voltage $U_{out}$ can then assume all the values within the entire output swing from $U_B - U_{CESAT}$ ($Q_3$) to $U_9 + U_{CESAT}(Q_1)$.

If the resistors $R_9$ and $R_{10}$ are selected in such a manner that the voltages $U_{10}$ (across $R_{10}$) and $U_9$ (across $R_9$) are approximately 200 mV different base-emitter voltages of the transistors $Q_2$ and $Q_5$ may be ignored in a first approximation. These different voltages occur in the case of a non-zero output current $I_{out}$ because $I_2$ is then no longer equal to $I_{ref}$, as will be demonstrated below.

The base-emitter voltage of a transistor for different collector currents $I_{c1}$ and $I_{c2}$ complies with:

$$\Delta \, U_{BE} = U_T \cdot \ln\left(\frac{I_{c1}}{I_{c2}}\right) \tag{5}$$

The input signal $U_1$ and the output signal $U_8$ comply with the following relationship:

$$U_{out} = \left(1 + \frac{R_8}{R_7}\right) \cdot (U_1 - 0.5 U_B) \tag{6}$$

If the output current $I_{out}$ of the amplifier arrangement is not zero the second differential amplifier $V_6$ will drive $Q_1$ in such a manner that the output current will flow through the transistor $Q_1$ to the reference potential because the current sum in the node $K_{12}$ should be zero (equation (1)). Now it follows from equation (3) that:

$$I_9' = I_1' + I_2' + I_{out} = 3 \, I_2' + I_{out} \tag{7}$$

However, if $I_9$ should remain substantially constant, i.e. if it should not vary with $I_{out}$, this requires that: $I_9' = I_9$. In conjunction with equations (3) and (7) this yields the following relationships:

$$3 \, I_2' + I_{out} = 3 \, I_2 = 3 \, I_{ref} \tag{8}$$

or $$I_2' = I_{ref} - 0.33 \, I_{out} \tag{9}$$

In combination with equation (5) it follows that if the current $I_2$ should reach its value $I_2'$:

$$\Delta U_{BE}(Q_2) = U_T \cdot \ln\left(1 - 0.33 \frac{I_{out}}{I_{ref}}\right) \quad (10)$$

This equation means, if $$\Delta U_9 = -\Delta U_{BE}(Q_2) \quad (11)$$

that for a current $I_{out}$ smaller than 0 this current will flow into the node $K_{12}$ and, via $Q_1$ and $R_9$ to earth. However, the second differential amplifier $V_6$ then drives $Q_1$ in such a manner that equation (11) remains valid, i.e. the current $I_2$ decreases by 0.33 times the current $I_{out}$. However, owing to the relationship in accordance with equation (2) 13 will decrease by a factor of $0.66 \cdot I_{out}$. From equations (1) and (3) it follows that the current $I_9$ does not change approximately i.e. changes only to a small extent.

However, a control deviation produces a voltage $U_9$ across $R_9$, which depends logarithmically on $I_{out}$ in accordance with equations (10) and (11). If, for example, the currents $I_{out}$ and $I_{ref}$ have the same value and a voltage $U_9$ is produced across the resistor $R_9$, it follows from equations (7), (10) and (11) that:

$$\Delta I_9 \approx 0.15 \cdot I_{out}.$$

This means that only approximately 15% of the output current flows in the resistor $R_9$. Thus, only a small current flows to the reference potential. This applies both to the output direct currents and to the signal currents.

This small influence of the output current $I_{out}$ on the current $I_9$ which flows to reference potential has the advantage that, for example, if the arrangement is realised in an integrated circuit, only a correspondingly small part of the signal current flows to the earth conductor which is at an external reference potential, so that only correspondingly small voltage drops appear on this earth conductor. This is desirable because for other circuits in the IC these voltage drops cause the reference potential for these other circuits to change accordingly. This means that the output signal of the amplifier arrangement is transmitted to other circuit elements in the IC via these voltages on the earth conductor. For these circuit elements this means cross-talk of the output current of the amplifier arrangement and a consequent deterioration of the signal-to-noise ratio. The amplifier arrangement in accordance with the invention considerably reduces these adverse effects.

What is claimed is:

1. An amplifier arrangement comprising:
a first differential amplifier which comprises a first and a second transistor whose emitters are coupled to a reference potential via a common first resistor, the collector of the first transistor forming an output node of the amplifier arrangement,
a second differential amplifier to whose input side the input signal of the amplifier arrangement is applied, whose output side is coupled to the base of the first transistor of the first differential amplifier, and having an inverting input coupled to the output node of the amplifier arrangement,
a first current mirror circuit having an input transistor to which a reference current is applied, having an output transistor which is formed by the second transistor of the first differential amplifier, and having the emitter side of both transistors coupled to a reference potential, and
a second current mirror circuit to whose input side the output signal of the first current mirror circuit is applied and whose output side is coupled to the output node of the amplifier arrangement, which second current mirror circuit has two transistors coupled to a supply potential at the emitter side, which transistors are scaled in such a manner that the current supplied by the amplifier arrangement at its output side is twice as large as the input current applied to the arrangement.

2. The amplifier arrangement as claimed in claim 1, characterized in that the emitter of the input transistor of the first current mirror circuit is coupled to reference potential via a second resistor, across which a voltage drop of substantially the same voltage value as that across the first resistor appears.

3. The amplifier arrangement as claimed in claim 1, characterized in that the input signal of the amplifier arrangement is applied to a non-inverting input of the second differential amplifier, and an inverting input of the second differential amplifier is coupled to the output node of the amplifier arrangement and to half the value of the supply potential.

4. The amplifier arrangement as claimed in claim 1, characterized in that the supply potential has a positive voltage value relative to the reference potential, the two transistors of the first differential amplifier and the input transistor of the first current mirror circuit are of the NPN conductivity type, and the two transistors of the second current mirror circuit are of the PNP conductivity type.

5. The amplifier as claimed in claim 2, characterized in that the input signal of the amplifier arrangement is applied to a non-inverting input of the second differential amplifier, and an inverting input of the second differential amplifier is coupled to the output node of the amplifier arrangement and to half the value of the supply potential.

6. The amplifier arrangement as claimed in claim 2, characterized in that the supply potential has a positive voltage value relative to the reference potential, the two transistors of the first differential amplifier and the input transistor of the first current mirror circuit are of the NPN conductivity type, and the two transistors of the second current mirror circuit are of the PNP conductivity type.

7. The amplifier arrangement as claimed in claim 3, characterized in that the supply potential has a positive voltage value relative to the reference potential, the two transistors of the first differential amplifier and the input transistor of the first current mirror circuit are of the NPN conductivity type, and the two transistors of the second current mirror circuit are of the PNP conductivity type.

8. The amplifier arrangement as claimed in claim 5, characterized in that the supply potential has a positive voltage value relative to the reference potential, the two transistors of the first differential amplifier and the input transistor of the first current mirror circuit are of the NPN conductivity type, and the two transistors of the second current mirror circuit are of the PNP conductivity type.

* * * * *